United States Patent
Maeda et al.

(10) Patent No.: US 6,924,079 B2
(45) Date of Patent: Aug. 2, 2005

(54) RESIST RESIN, CHEMICAL AMPLIFICATION TYPE RESIST, AND METHOD OF FORMING OF PATTERN WITH THE SAME

(75) Inventors: Katsumi Maeda, Tokyo (JP); Shigeyuki Iwasa, Tokyo (JP); Kaichiro Nakano, Tokyo (JP); Etsuo Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/240,404

(22) PCT Filed: Jul. 2, 2001

(86) PCT No.: PCT/JP01/05693

§ 371 (c)(1),
(2), (4) Date: Sep. 30, 2002

(87) PCT Pub. No.: WO02/05034

PCT Pub. Date: Jan. 17, 2002

(65) Prior Publication Data

US 2003/0211734 A1 Nov. 13, 2003

(30) Foreign Application Priority Data

Jul. 7, 2000 (JP) .................................. 2000-207500

(51) Int. Cl.[7] .............................................. G03F 7/039
(52) U.S. Cl. .............................. 430/270.1; 430/281.1; 430/286.1; 430/905; 430/910; 430/322; 526/270; 438/676
(58) Field of Search .......................... 430/270.1, 281.1, 430/286.1, 905, 910, 322; 526/270; 438/676

(56) References Cited

U.S. PATENT DOCUMENTS

| | | | | |
|---|---|---|---|---|
| 6,251,560 B1 | * | 6/2001 | Wallow et al. | 430/270.1 |
| 6,284,429 B1 | * | 9/2001 | Kinsho et al. | 430/270.1 |
| 6,403,280 B1 | * | 6/2002 | Yamahara et al. | 430/270.1 |
| 6,406,828 B1 | * | 6/2002 | Szmanda et al. | 430/270.1 |
| 6,500,961 B2 | * | 12/2002 | Nishi et al. | 549/271 |
| 6,531,627 B2 | * | 3/2003 | Nishi et al. | 560/128 |
| 6,552,143 B2 | * | 4/2003 | Funaki et al. | 526/271 |
| 6,596,463 B2 | * | 7/2003 | Hasegawa et al. | 430/285.1 |
| 2002/0004569 A1 | * | 1/2002 | Hatakeyama et al. | 526/242 |
| 2002/0009667 A1 | * | 1/2002 | Nishimura et al. | 430/270.1 |
| 2002/0013448 A1 | * | 1/2002 | Barclay et al. | 528/271 |
| 2002/0155378 A1 | * | 10/2002 | Uetani et al. | 430/270.1 |

FOREIGN PATENT DOCUMENTS

| | | |
|---|---|---|
| JP | 05-134416 | 5/1991 |
| JP | 10-073919 | 3/1998 |
| JP | 10-130340 | 5/1998 |
| JP | 10-153864 | 6/1998 |
| JP | 10-218941 | 8/1998 |
| JP | 10-316720 | 12/1998 |
| JP | 11-255840 | 9/1999 |
| JP | 11-305444 | 11/1999 |
| JP | 2000-047387 | 2/2000 |
| JP | 2000-038416 | 8/2000 |
| JP | 2001-081139 | 3/2001 |
| JP | 2001-215703 | 8/2001 |

OTHER PUBLICATIONS

International Search Report dated Aug. 24, 2001.

Takumi Ueno, et al.,"Chemical Amplification Positive Resist Systems Using Novel Sulfonates as Acid Generators", Proceeding of PME' 89, Kodanska pp. 413 to 424 (1990).

F. M. Houlihan, et al., "The Synthesis, Characterization and Lithography of Substituted 2–Nitrobenzyl Arylsulfonate Photo–Acid Generators with Improved Resistance to Post Exposure Bake",SPIE, vol. 2195/137, 1994, pp. 137–151.

James V. Crivello, et al., "A New Preparation of Triarylsulfonium and selenonium Salts via the Copper (II)—Catalyzed Arylation of Sulfides and Selenides with Diaryliodonium Salts", American Chemical Society, J. Org. Chem., vol. 43 No. 15, 1978, pp.3055–3058.

F. M. Houlihan, et al., "Synthesis of Cycloolefin–Maleic Anhydride Alternating Copolymers for 193 nm Imaging", American Chemical Society, 1997, pp. 6517–6524.

R. D. Allen, et al., "Progress in 193 nm Positive Resists", Journal of Photopolymer Science and Technology, vol. 9, No. 3 (1996), pp. 465–474.

(Continued)

Primary Examiner—Yvette C. Thornton
(74) Attorney, Agent, or Firm—McGinn & Gibb, PLLC

(57) ABSTRACT

The present invention relates to a resist resin having an acid-decomposable group, which gives rise to decomposition of the acid-decomposable group to show an increased solubility to an aqueous alkali solution by the action of an acid, wherein the resist resin has, in the main chain, an alicyclic lactone structure represented by the following general formula (1). According to the present invention, a positive-type chemically amplified resist can be obtained which has high transparency to a far-ultraviolet light having a wavelength of about 220 nm or less, excellent etching resistance, and excellent adhesion to substrate; and a fine pattern required in production of semiconductor device can be formed.

(1)

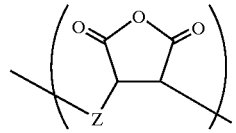

(wherein Z is an alicyclic hydrocarbon group having a lactone structure).

24 Claims, No Drawings

OTHER PUBLICATIONS

R. D. Allen, et al., "Resolution and Etch Resistance of a Family of 193 nm Positive Resists", Journal of Photopolymer Science and Technology, vol. 8, No. 4 (1995), pp. 623–636.

Takechi, et al., "Alicyclic Polymer for ArF and KrF Exicimer Resist Based on Chemical Amplification", Journal of Photopolymer Science and Technology, vol. 5, No. 3 (1992), pp. 439–445.

Hiroshi, et al., "Applications of Photoinitiators to the Design of Resists for Semiconductor Manufacturing", American Chemical Society, 1984, pp. 11–23.

D. C. Hofer, et al., "193 nm Photoresist R&D: The Risk & Challenge", Journal of Photopolymer Science and Technology, vol. 9, No. 3 (1996), pp. 387–397.

* cited by examiner

RESIST RESIN, CHEMICAL AMPLIFICATION TYPE RESIST, AND METHOD OF FORMING OF PATTERN WITH THE SAME

TECHNICAL FIELD

The present invention relates to a resist resin, a chemically amplified resist, and a method of forming pattern using the resist. More particularly, the present invention relates to a resist resin and a chemically amplified resist to be exposed with, as an exposure light, a far-ultraviolet light having a wavelength of about 220 nm or less as well as a method of forming pattern using the resist.

BACKGROUND ART

In production of semiconductor devices typified by LSIs (large scale integrated circuits), photolithography is indispensable in order to subject an insulating film (e.g. a silicon oxide film or a silicon nitride film), a conductive film (e.g. an aluminum alloy film or a copper alloy film) both formed on a semiconductor substrate, or a to-be-processed material containing a semiconductor substrate, to patterning to be a desired shape.

In this photolithography, it has been conducted to coat an ultraviolet light-sensitive photoresist on a to-be-processed material to form a photoresist film and then apply an ultraviolet light to the photoresist film through a mask pattern to make the ultraviolet light-applied area of the film soluble (in the case of a positive-type photoresist) or insoluble (in the case of a negative-type photoresist). Then, the photoresist film is subjected to a development treatment to remove the soluble area partially with a solvent and form a resist pattern, after which the to-be-processed material is etched selectively using the resist pattern as a mask to conduct patterning.

As the photoresist, positive-type novolak-based photoresists have been used generally. Positive-type photoresists are superior in resolution to negative-type photoresists and therefore have been used mainly as the above photoresist. Meanwhile, as the light applied to the photoresist, ultraviolet lights such as g-line (wavelength: about 436 nm), i-line (wavelength: about 365 nm) and the like were used. However, in order to obtain a more precise resist pattern, a photolithography using a far-ultraviolet light consisting of a KrF (krypton fluoride) excimer laser beam (wavelength: about 248 nm) has been developed and come to be used.

With the higher integration of LSIs, a photolithography to form a finer pattern has become necessary. In this connection, the light to be applied to photoresists is being shifted to an ultraviolet light of shorter wavelength capable of giving a higher resolution. Consequently, in production of, in particular, a DRAM (dynamic random access memory) having an integration of 1 gigabit or more, where microfabrication technology of 0.13 µm or less is required, it has recently come to be considered to use a photolithography using an ArF (argon fluoride) excimer laser beam (wavelength: about 193 nm) which generates a far-ultraviolet light having a wavelength shorter than that of the above-mentioned KrF excimer laser beam [Donald C. Hoffer et al., Journal of Photopolymer Science and Technology, Vol. 9 (No. 3), pp. 387 to 397 (1996)].

When the above ArF excimer laser beam is applied to a conventional novolac-based photoresist mentioned above, however, it is difficult to from an excellent resist pattern because the novolac-based photoresist shows a high light absorption. Therefore, it is desired to develop a resist resin for the photolithography using an ArF excimer laser beam.

In development of a photoresist resin allowing the use of an ArF excimer laser beam, an improved cost performance of laser must be realized because the gas as a raw material of laser has a short life and the laser beam machine is costly. Therefore, a high sensitivity as well as a high resolution enabling microfabrication is required strongly for the photoresist resin.

As for the photoresist with a higher sensitivity, a chemically amplified resist using a photo acid generator (which is a sensitizer) is well known. It is described in, for example, JP-B-2-27660. The literature describes a resist comprising a combination of triphenylsulfonium hexafluoroarsenate and a poly(p-tert-butoxycarbonyloxy-α-methylstyrene). Such a chemically amplified resist is currently in wide use in resists for KrF excimer laser beam [for example, Hiroshi Ito and C. Grant Wilson, American Chemical Society Symposium Series, Vol. 242, pp. 11 to 23 (1984)]. The feature of chemically amplified resists lies in that the photo acid generator contained therein as a component generates a proton acid upon irradiation with a light and this proton acid gives rise to an acid-catalyzed reaction with the resist resin and the like, in a heat treatment after light application. Thus, there can be obtained a strikingly high sensitivity in the resists as compared with those of conventional resists with a photoreaction efficiency (a reaction per one photon) of less than 1. Most of the resists being developed currently are chemically amplified resists.

In a lithography using a far-ultraviolet light having a wavelength of about 220 nm or less, typified by an ArF excimer laser beam, however, the resist used therein for forming fine patterns needs to have novel properties which cannot be satisfied by the conventional materials, that is, high transparency to an exposing light having a wavelength of about 220 nm or less and the resistance to dry etching.

In the above-mentioned conventional photoresist resins for g-line (wavelength: about 438 nm), i-line (wavelength: about 365 nm) and KrF excimer laser beam (wavelength: about 248 nm), as the resin component, mainly a resin having an aromatic ring in the structural units, such as novolac resin, poly(p-vinylphenol) or the like is used, and can maintain the dry etching resistance owing to the dry etching resistance of the aromatic ring. Resins having an aromatic ring, however, show very high absorption to a light having a wavelength of about 220 nm or less. Therefore, the most part of the exposed light with the wavelength of about 220 nm or less is absorbed on the surface of the resist and the light does not reach a substrate. As a result of it, a fine resist pattern cannot be formed. Thus, the conventional resins are not applicable in the photolithography using a far-ultraviolet light of about 220 nm or less. There is accordingly a strong desire for a new resist resin, which has the high transparency to the far-ultraviolet light having a wavelength of about 220 nm or less without having the aromatic ring and has the resistance to the dry etching.

As polymer compounds having transparency to an ArF excimer laser beam (wavelength: about 193 nm) and further having dry etching resistance, there were proposed the alicyclic polymers, i.e. a copolymer having adamantyl methacrylate units [Takechi et al., Journal of Photopolymer Science and Technology, Vol. 5 (No. 3), pp. 439 to 446 (1992)] and a copolymer having isobornyl methacrylate units [R. D. Allen et al., Journal of Photopolymer Science and Technology, Vol. 8 (No. 4), pp. 623 to 636 (1995) and Vol. 9 (No. 3), pp. 465 to 474 (1996)] (these polymers are hereinafter referred to as former resin).

There was also proposed the resin having norbornene-maleic anhydride alternating copolymer units [F. M. Houlihan et al., Macromolecules, Vol. 30, pp. 6517 to 6524 (1997)] (the resin is hereinafter referred to as latter resin).

Each of the above-mentioned resist resins for a lithography using a far-ultraviolet light having a wavelength of about 220 nm or less, typified by an ArF excimer laser beam, however, has the following drawbacks.

First, the alicyclic group-containing (meth)acrylate derivative used in the former resin has no polar group (e.g. carboxy group or hydroxy group) having adhesivity to substrate. As for a homopolymer of an alicyclic group-containing monomer, the adhesivity with the substrate to-be-processed (e.g. silicon substrate) is not good because it has high hydrophobicity, and the uniform film formation at high reproducibility may be impossible. Further, the units of adamantane-containing residue, isobornyl-containing residue or menthyl-containing residue have no residue which shows the solubility difference before and after exposure. Therefore it is impossible to form a pattern by exposure. Thus, the former resin can be used as a resist resin only when made into a copolymer with a comonomer capable of exhibiting solubility difference, such as tert-butyl methacrylate, tetrahydro methacrylate or the like, or with a comonomer having adhesivity to substrate, such as methacrylic acid or the like. However, the content of the comonomer is required to be about 50 mole % and the comonomer units have very low resistance to dry etching. As a result, the dry etching resistance for the resin with alicyclic group decreases significantly by the copolymerization with the comonomer, and the practical applicability as a dry etching-resistant resin is low.

Next, the latter resin (the resin using a norbornene-maleic anhydride alternating copolymer) as well has low adhesivity to a substrate because the norbornane ring has no polar group. Therefore, the resin having the units of a norbornene-maleic anhydride alternating copolymer can be used by making it to copolymerization with acrylic acid or the like with a good adhesivity to the substrate. However, the practicality as the dry etching-resistant resin decreases.

Hence, there is a strong need for a novel positive-type chemically amplified resist which has high transparency to a far-ultraviolet light with a wavelength of about 220 nm or less, high etching resistance and high adhesivity to a substrate.

DISCLOSURE OF THE INVENTION

The present invention has been made in view of the above-mentioned situation and aims at providing a resist resin and a chemically amplified resist which have high transparency to a far-ultraviolet light having a wavelength of about 220 nm or less, high etching resistance and high adhesivity to substrate, and a method for pattern formation using the resist.

In order to achieve the above aim, the first aspect of the present invention lies in a resist resin having an acid-decomposable group, which gives rise to decomposition of the acid-decomposable group to show an increased solubility to an aqueous alkali solution by the action of an acid, wherein resist resin is characterized by having an alicyclic lactone structure in the main chain.

The second aspect of the present invention lies in a resist resin of the first aspect of the present invention wherein the alicyclic lactone structure is represented by the following general formula (1):

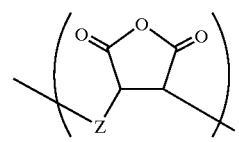

(wherein Z is an alicyclic hydrocarbon group having a lactone structure).

The third aspect of the present invention lies in a resist resin of the first aspect of the invention wherein the alicyclic lactone structure is represented by the following general formula (2):

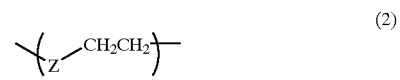

(wherein Z is an alicyclic hydrocarbon group having a lactone structure).

The fourth aspect of the present invention lies in a resist resin of the first aspect of the invention wherein the alicyclic lactone structure is represented by the following general formula (3):

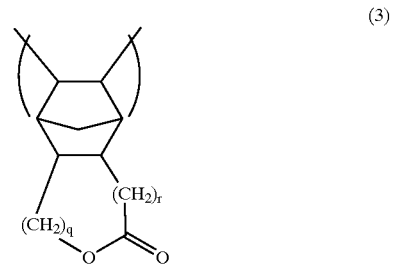

(wherein q is 0 or a positive integer of 1 to 3, and r is 1 or 2).

The fifth aspect of the present invention lies in a resist resin of the first aspect of the invention wherein the alicyclic lactone structure is represented by the following general formula (4):

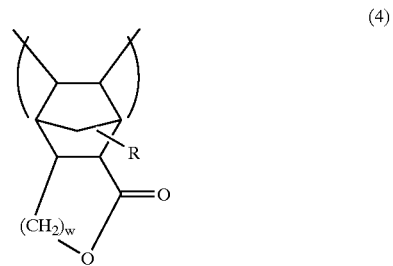

(wherein R is an alkyl group having 1 to 4 carbon atoms, and w is a positive integer of 1 to 3).

The sixth aspect of the present invention lies in a resist resin of the first aspect of the invention wherein the resin having an alicyclic lactone structure in the main chain is represented by the following general formula (5):

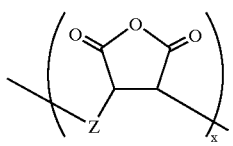 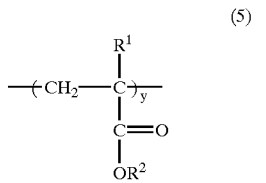 (5)

(wherein Z is an alicyclic hydrocarbon group having a lactone structure; $R^1$ is a hydrogen atom or a methyl group; $R^2$ is an acid-decomposable group or a bridge cyclic hydrocarbon group of 7 to 13 carbon atoms having an acid-decomposable group; and X and y are each any number satisfying x+y=1, 0<x<1 and 0<y<1).

The seventh aspect of the present invention lies in a resist resin of the first aspect of the invention wherein the resin having an alicyclic lactone structure in the main chain is represented by the following general formula (6):

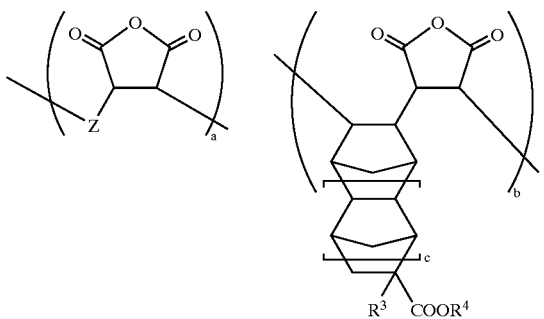 (6)

(wherein Z is an alicyclic hydrocarbon group having a lactone structure; $R^3$ is a hydrogen atom or a methyl group; $R^4$ is an acid-decomposable group; a and b are each any number satisfying a+b=1, 0<a<1 and 0<b<1; and c is 0 or 1).

The eighth aspect of the present invention lies in a resist resin of the first aspect of the invention wherein the resin having an alicyclic lactone structure in the main chain is represented by the following general formula (7):

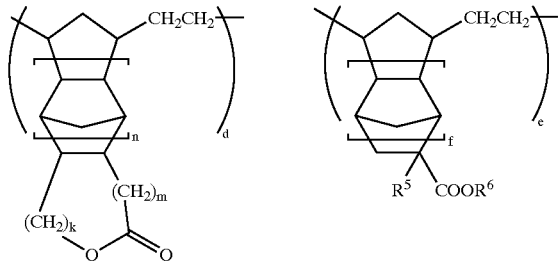 (7)

(wherein k is 0 or a positive integer of 1 to 3; m is 0, 1 or 2; n and f are each 0 or 1; $R^5$ is a hydrogen atom or a methyl group; $R^6$ is an acid-decomposable group; and d and e are each any number satisfying d+e=1, 0<d<1 and 0<e<1).

The ninth aspect of the present invention lies in a resist resin of the first aspect of the invention wherein the resin having an alicyclic lactone structure in the main chain is represented by the following general formula (8):

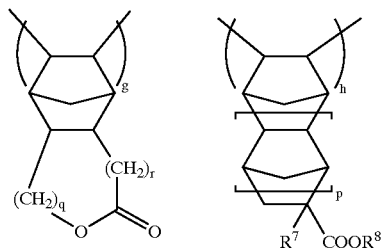 (8)

[wherein q is 0 or a positive integer of 1 to 3; r is 0, 1 or 2; p is 0 or 1 (with a proviso that when r is 0, p is 1); $R^7$ is a hydrogen atom or a methyl group; $R^8$ is an acid-decomposable group; and g and h are each any number satisfying g+h=1, 0<g<1 and 0<h<1].

The tenth aspect of the present invention lies in a resist resin of the first aspect of the invention wherein the resin having an alicyclic lactone structure in the main chain is represented by the following general formula (9):

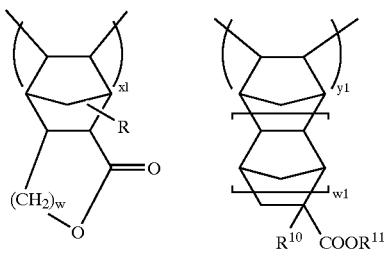 (9)

(wherein R is an alkyl group of 1 to 4 carbon atoms; w is a positive integer of 1 to 3; wl is 0 or 1; $R^{10}$ is a hydrogen atom or a methyl group; $R^{11}$ is an acid-decomposable group; and xl and yl are each any number satisfying xl+yl=1, 0<xl<1 and 0<yl<1).

The eleventh aspect of the present invention lies in a chemically amplified resist characterized by being a positive-type chemically amplified resist containing at least a resist resin of any of the first to tenth aspect of the invention and a photo acid generator which generates an acid when exposed to a light.

The twelfth aspect of the present invention lies in a method of forming a pattern, which comprises:
a step of coating a chemically amplified resist of the eleventh aspect of the invention on a substrate to be processed,
a step of exposing the coated substrate to a light having a wavelength of 180 to 220 nm,
a step of baking the resulting substrate, and
a step of subjecting the baked substrate to development.

The thirteenth aspect of the present invention lies in a method of forming a pattern according to the twelfth aspect of the invention, wherein the light is an ArF excimer laser beam.

The resin for the resist of the present invention has the alicyclic lactone structure in the main chain. Therefore, a positive-type chemically amplified resist with an excellent dry etching resistance and transparency is obtained by using this resin in the present invention. Also, the resist of the present invention has a high pattern resolution and is excellent adhesivity to a substrate. According to the method of the present invention, a fine pattern necessary for manufacturing the semiconductor element.

BEST MODE FOR CARRYING OUT THE INVENTION

The inventors of the present invention made a study in order to achieve the above aim. As a result, the present invention has been completed. The present invention is basically characterized by a resist resin having an alicyclic lactone structure in the main chain and is also characterized by a chemically amplified resist containing the resist resin and a method for pattern formation using the resist.

As the resist resin having an alicyclic lactone structure in the main chain, the resin having one of the structural units represented by the general formulas (1) to (4) can be enumerated. Specific examples of the resins each having one of the structural units represented by the general formulas (1) to (4) include resins represented by the general formulas (5) to (9) but are not restricted thereto. The resins represented by the general formulas (5) to (9) may further contain copolymerizable structural units. Other copolymerizable vinyl monomers include, for example, (meth)acrylic acid; aliphatic esters of (meth)acrylic acid, such as methyl (meth)acrylate, ethyl (meth)acrylate and the like; alicyclic esters of (meth)acrylic acid, such as adamantyl (meth)acrylate, tricyclodecyl (meth)acrylate, tetracyclododecyl (meth)acrylate, norbornyl (meth)acrylate, isobornyl (meth)acrylate and the like; lactone structure-containing (meth)acrylate derivatives described in JP-A-2000-26446; norbornene derivatives containing carboxy group, hydroxy group or the like (e.g. 5-norbornene-2-ol, 5-norbornene-2-methanol and 5-nobornene-2-carboxylic acid); tetracyclododecyl derivatives containing carboxy group, hydroxy group or the like (3-tetracyclo[4.4.0.1$^{2,5}$.1$^{7,10}$]dodecene-8-carboxylic acid, 3-tetracyclo[4.4.0.1$^{2,5}$.1$^{7,10}$]dodecene-8-ol, 3-tetracyclo[4.4.0.1$^{2,5}$.1$^{7,10}$]dodecene-8-methanol); and itaconic anhydride. However, the other copolymerizable vinyl monomers are not restricted thereto.

Preferable weight-average molecular weight of the resin is 2,000 to 200,000 and more preferable 3,000 to 100,000.

The resist resin of the present invention has, in the main chain, an alicyclic hydrocarbon group having a lactone structure and is characterized by the lactone structure. In general, lactone structure, as compared with ester structure, ether structure and alcohol structure, has a high relative dielectric constant [when comparison is made with, for example, C-4 compounds, the relative dielectric constant of γ-butyrolactone is 39, that of ethyl acetate is 6.02, that of diethyl ether is 4.335, and that of 1-butanol is 17.51, as described in, for example, Kagaku Binran (Basic Volume II), Third Revision (1981), Maruzen Co. Ltd, p. 502]. Therefore, a resin having an alicyclic lactone skeleton in the main chain has a high polarity, and the resin of the present invention has a feature that a resist using the resin shows very good adhesivity to the substrate.

The resin of the present invention has an alicyclic hydrocarbon group, in addition to the lactone structure; therefore, the present invention's resin also has a feature of excellent dry etching resistance.

One of raw materials used in synthesis of the present invention's resin, i.e. a norbornene derivative having a lactone structure, represented by the following formula (19) is synthesized by, for example, the following method.

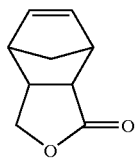

(19)

That is, the norbornene derivative is synthesized by reducing 5-norbornene-endo-2,3-dicarboxylic acid anhydride or 5-norbornene-exo-2,3-dicarboxylic acid anhydride [W. Heitz et al., Macromol. Chem. Phys. Vol. 200, pp. 338 to 347 (1999)] with sodium boron hydride (NaBH$_4$) in tetrahydrofuran according to the method by D. M. Bailey et al., described in J. Org. Chem. Vol. 35, pp. 3,574 to 3,576 (1970). The following reaction formula (20) shows the above reaction.

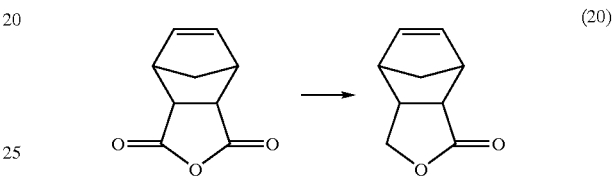

(20)

A norbornene derivative having a lactone structure, represented by the following formula (21) is synthesized by, for example, the following method.

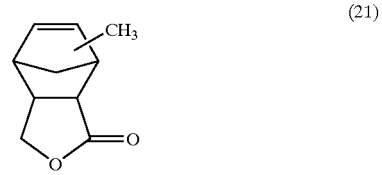

(21)

That is, the norbornene derivative is synthesized by reducing methyl-5-norbornene-endo-2,3-dicarboxylic acid anhydride or methyl-5-norbornene-exo-2,3-dicarboxylic acid anhydride with sodium boron hydride (NaBH$_4$) in tetrahydrofuran according to the method by D. M. Bailey et al., described in J. Org. Chem. Vol. 35, pp. 3,574 to 3,576 (1970). The norbornene derivative is synthesized also by a Diels-Alder reaction between methylcyclopentadiene (obtained by pyrolysis of methylcyclopentadiene dimer) and 2(5H)-furanone.

The following reaction formula (22) shows the above reaction.

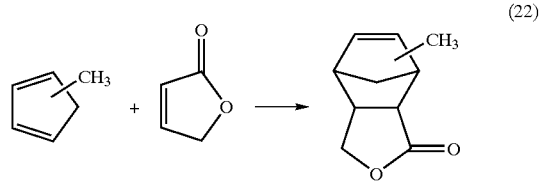

(22)

The resin represented by the general formula (5) is synthesized by, for example, the following method. That is, the resin is synthesized by reacting maleic anhydride, an alicyclic olefin having a lactone structure (e.g. a norbornene derivative having a lactone structure, represented by the formula (19)) and a (meth)acrylate derivative having acid-decomposable group (e.g. tert-butoxycarbonyltetraclododecyl acrylate) in dry tetrahydrofuran in the presence of a radical polymerization initiator (e.g. azobisisobutyronitrile) at 60 to 65° C. for 2 to 24 hours.

The resin represented by the general formula (6) is synthesized by, for example, the following method. That is, the resin is synthesized by reacting maleic anhydride, an alicyclic olefin having a lactone structure (e.g. a norbornene derivative having a lactone structure, represented by the formula (19)) and an alicyclic olefin derivative having acid-decomposable group (e.g. tert-butyl 5-norbornene-2-carboxylate) in dry tetrahydrofuran in the presence of a radical polymerization initiator (e.g. azobisisobutyronitrile) at 60 to 65° C. for 2 to 24 hours.

The resin represented by the general formula (7) is synthesized by, for example, the following method. That is, the resin is synthesized by subjecting an alicyclic olefin having a lactone structure (e.g. a norbornene derivative having a lactone structure, represented by the formula (19)) and an alicyclic olefin derivative having acid-decomposable group (e.g. tert-butyl 3-tetracyclo[4.4.0.1$^{2,5}$.1$^{7,10}$]dodecene-8-carboxylate) to ring-opening polymerization using a metathesis catalyst [which includes, for example, halides of transition metals (e.g. W, Mo and Re), such as $WCl_6$, $MoCl_5$, $ReCl_3$ and the like but is not restricted thereto] and hydrogenating the resulting polymer using a noble metal catalyst such as Pd.

The resin represented by the general formula (8) is synthesized by, for example, the following method. That is, the resin is synthesized by subjecting an alicyclic olefin having a lactone structure [e.g. 5,8-methano-3,4,4a,5,8,8a-hexahydro-3H-2-benzopyran-3-one (H. Shimomura et al., Tetrahedron Lett., No. 45, pp. 4,099 to 4,102 (1976))] and tert-butyl 5-norbornene-2-carboxylate to addition polymerization using, as a catalyst, a palladium compound (e.g. $\{(\eta^3\text{-allyl})Pd(BF_4)\}$ or $[Pd(CH_3CN)_4][BF_4]_2$) according to the method of J. P. Mathews et al., described in Macromolecules, Vol. 29, pp. 2,755 to 2,763 (1996).

The resin represented by the general formula (9) is synthesized by, for example, the following method. That is, the resin is synthesized by subjecting an alicyclic olefin having a lactone structure (e.g. a norbornene derivative having a lactone structure, represented by the formula (21)) and tert-butyl 3-tetracyclodecene-8-carboxylate to addition polymerization using, as a catalyst, a palladium compound (e.g. $\{(\eta^3\text{-allyl})Pd(BF_4)\}$ or $[Pd(CH_3CN)_4][BF_4]_2$) according to the method of J. P. Mathews et al., described in Macromolecules, Vol. 29, pp. 2,755 to 2,763 (1996).

In the general formula (1) and the general formula (2), Z is an alicyclic hydrocarbon group having a lactone structure. Specific examples of Z include norbornane derivatives having a lactone structure, tetracyclo[4.4.0.1$^{2,5}$.1$^{7,10}$]dodecane derivatives having a lactone structure, cyclopentane derivatives having a lactone structure and tricyclodecane derivatives having a lactone structure, all shown in Table 1 and Table 2 but are not restricted thereto.

TABLE 1

| | Chemical structure of Z |
|---|---|
| Norbornane derivative (1) having a lactone structure | 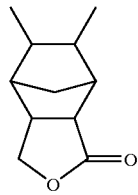 |
| Norbornane derivative (2) having a lactone structure | 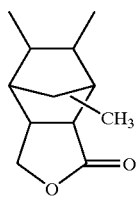 |
| Norbornane derivative (3) having a lactone structure | 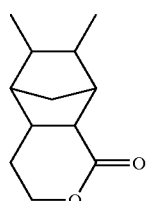 |
| Norbornane derivative (4) having a lactone structure | 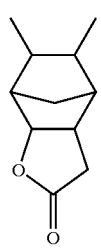 |
| Norbornane derivative (5) having a lactone structure | 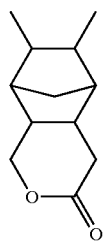 |

TABLE 2

| | |
|---|---|
| Tetracyclo[4.4.0.1$^{2,5}$.1$^{7,10}$]-dodecane derivative (1) having a lactone structure | 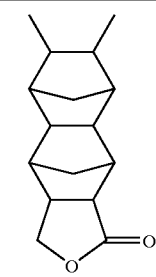 |

TABLE 2-continued

| | |
|---|---|
| Tetracyclo[4.4.0.1$^{2,5}$.1$^{7,10}$]-dodecane derivative (2) having a lactone structure | 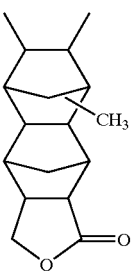 |
| Tetracyclo[4.4.0.1$^{2,5}$.1$^{7,10}$]-dodecane derivative (3) having a lactone structure | 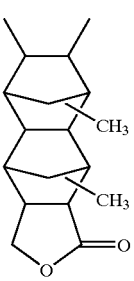 |
| Cyclopentane derivative (1) having a lactone structure | 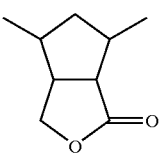 |
| Cyclopentane derivative (2) having a lactone structure | 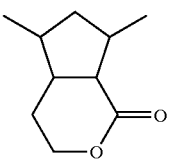 |
| Cyclopentane derivative (3) having a lactone structure | 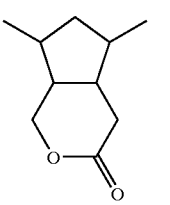 |
| Tricyclodecane derivative (1) having a lactone structure | 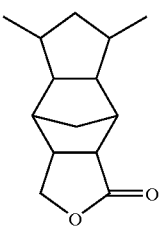 |
| Tricyclodecane derivative (2) having a lactone structure | 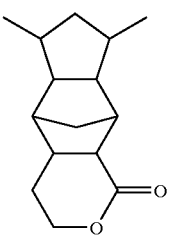 |

In the general formula (3), q is 0 or a positive integer of 1 to 3, and r is 1 or 2.

In the general formula (4), R is an alkyl group having 1 to 4 carbon atoms (specifically, a methyl group, an ethyl group, a propyl group or a butyl group); and w is a positive integer of 1 to 3.

In the general formula (5), $R^1$ is a hydrogen atom or a methyl group; and $R^2$ is a group which is decomposed by the action of an acid, or a bridge cyclic hydrocarbon group of 7 to 13 carbon atoms having a group which is decomposed by the action of an acid. Specific examples of the group which is decomposed by the action of an acid, include tert-butyl group, tetrahydropyran-2-yl group, tetrahydrofuran-2-yl group, 4-methoxytetrahydropyran-4-yl group, 1-ethoxyethyl group, 1-butoxyethyl group, 1-propoxyethyl group, 3-oxocyclohexyl group, 2-methyl-2-adamantyl group, 2-ethyl-2-adamantyl group, 8-methyl-8-tricyclo[5.2.1.0$^{2,6}$] decyl group, 1,2,7,7-tetramethyl-2-norbornyl group, 2-acetoxymenthyl group, 2-hydroxymenthyl group and 1-methyl-1-cyclohexylethyl group, but are not restricted thereto. Specific examples of the bridge cyclic hydrocarbon group of 7 to 13 carbon atoms having a group which is decomposed by the action of an acid, include tricyclo[5.2.1.0$^{2,6}$]decylmethyl group having ester group, tricyclo[5.2.1.0$^{2,6}$]decyl group having ester group, adamantyl group having ester group, norbornyl group having ester group, methylnorbornyl gorup having ester group, isobornyl gorup having ester group, tetracyclo[4.4.0.1$^{2,5}$.1$^{7,10}$]dodecyl group having ester group and methyltetracyclo[4.4.0.1$^{2,5}$.1$^{7,10}$] dodecyl group having ester group, all shown in Table 3, but are not restricted thereto. ($R^9$ in Table 3 is a group which is decomposed by the action of an acid; and specific examples thereof are tert-butyl group, tetrahydropyran-2-yl group, tetrahydrofuran-2-yl group, 4-methoxytetrahydropyran-4-yl group, 1-ethoxyethyl group, 1-butoxyethyl group, 1-propoxyethyl group, 3-oxocyclohexyl group, 2-methyl-2-adamantyl group, 2-ethyl-2-adamantyl group, 3-hydroxy-1-adamantyl group, 8-methyl-8-tricyclo[5.2.1.0$^{2,6}$]decyl group, 1,2,7,7-tetramethyl-2-norbornyl group, 2-acetoxymenthyl group, 2-hydroxymenthyl group and 1-methyl-1-cyclohexylethyl group, but are not restricted thereto.) The proportion x of the units having an alicyclic lactone structure is 0<x<1 but is preferably 0.1<x<0.8 from the standpoints of the resolution, adhesivity to the substrate, etc. of resist.

TABLE 3

| | Chemical structure of group |
|---|---|
| Tricyclo[5.2.1.0$^{2,6}$]decylmethyl group having ester group | 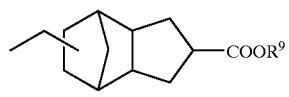 |
| Tricyclo[5.2.1.0$^{2,6}$]decyl group having ester group | 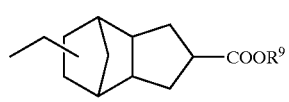 |

TABLE 3-continued

| Chemical structure of group | |
|---|---|
| Adamantyl group having ester group | [structure]—COOR$^9$ |
| Norbornyl group having ester group | [structure]—COOR$^9$ |
| Methylnorbornyl group having ester group | [structure with CH$_3$]—COOR$^9$ |
| Isorbornyl group having ester group | [structure with CH$_3$, CH$_3$, CH$_3$]—COOR$^9$ |
| Tetracyclo[4.4.0.1$^{2,5}$.1$^{7,10}$]-dodecyl group having ester group | [structure]—COOR$^9$ |
| Methyltetra-cyclo-[4.4.0.1$^{2,5}$.1$^{7,10}$]dodecyl group having ester group | [structure with CH$_3$]—COOR$^9$ |

In the general formula (6), c is 0 or 1; $R^3$ is a hydrogen atom or a methyl group; and $R^4$ is a group which is decomposed by the action of an acid. Specific examples of the group which is decomposed by the action of an acid, include tert-butyl group, tetrahydropyran-2-yl group, tetrahydrofuran-2-yl group, 4-methoxytetrahydropyran-4-yl group, 1-ethoxyethyl group, 1-butoxyethyl group, 1-propoxyethyl group, 3-oxocyclohexyl group, 2-methyl-2-adamantyl group, 2-ethyl-2-adamantyl group, 8-methyl-8-tricyclo[5.2.1.0$^{2,6}$]decyl group, 1,2,7,7-tetramethyl-2-norbornyl group, 2-acetoxymenthyl group, 2-hydroxymenthyl group and 1-methyl-1-cyclohexylethyl group, but are not restricted thereto. The proportion a of the units having an alicyclic lactone structure is 0<a<1 but is preferably 0.1<a<0.8 from the standpoints of the resolution, adhesivity to substrate, etc. of resist.

As the resin of the general formula (6), a resin of c=1 is preferred to a resin of c=0 because the former resin has a higher carbon density and has higher dry etching resistance.

In the general formula (7), k is 0 or a positive integer of 1 to 3; m is 0, 1 or 2; n and f are each 0 or 1; $R^5$ is a hydrogen atom or a methyl group; $R^6$ is a group which is decomposed by the action of an acid. Specific examples of the group which is decomposed by the action of an acid, include tert-butyl group, tetrahydropyran-2-yl group, tetrahydrofuran-2-yl group, 4-methoxytetrahydropyran-4-yl group, 1-ethoxyethyl group, 1-butoxyethyl group, 1-propoxyethyl group, 3-oxocyclohexyl group, 2-methyl-2-adamantyl group, 2-ethyl-2-adamantyl group, 8-methyl-8-tricyclo[5.2.1.0$^{2,6}$]decyl group, 1,2,7,7-tetramethyl-2-norbornyl group, 2-acetoxymenthyl group, 2-hydroxymenthyl group and 1-methyl-1-cyclohexylethyl group, but are not restricted thereto. The proportion d of the units having an alicyclic lactone structure is 0<d<1 but is preferably 0.1<d<0.8 from the standpoints of the resolution, adhesivity to substrate, etc. of resist.

As the resin of the general formula (7), a resin of n=1 and f=1 is preferred to a resin of n=0 and f=0 because the former resin has a higher carbon density and has higher dry etching resistance.

In the general formula (8), q is 0 or a positive integer of 1 to 3; r is 0, 1 or 2; p is 0 or 1 (when r is 0, p is 1); $R^7$ is a hydrogen atom or a methyl group; and $R^8$ is a group which is decomposed by the action of an acid. Specific examples of the group which is decomposed by the action of an acid, include tert-butyl group, tetrahydropyran-2-yl group, tetrahydrofuran-2-yl group, 4-methoxytetrahydropyran-4-yl group, 1-ethoxyethyl group, 1-butoxyethyl group, 1-propoxyethyl group, 3-oxocyclohexyl group, 2-methyl-2-adamantyl group, 2-ethyl-2-adamantyl group, 8-methyl-8-tricyclo[5.2.1.0$^{2,6}$]decyl group, 1,2,7,7-tetramethyl-2-norbornyl group, 2-acetoxymenthyl group, 2-hydroxymenthyl group and 1-methyl-1-cyclohexylethyl group, but are not restricted thereto. The proportion g of the units having an alicyclic lactone structure is 0<g<1 but is preferably 0.1<g<0.8 from the standpoints of the resolution, adhesivity to the substrate, etc. of resist.

As the resin of the general formula (8), a resin of p=1 is preferred to a resin of p=0 because the former resin has a higher carbon density and has higher dry etching resistance.

In the general formula (9), R is an alkyl group having 1 to 4 carbon atoms (specifically, a methyl group, an ethyl group, a propyl group or a butyl group); w is a positive integer of 1 to 3; w1 is 0 or 1; $R^{10}$ is a hydrogen atom or a methyl group; and $R^{11}$ is a group which is decomposed by the action of an acid. Specific examples of the group which is decomposed by the action of an acid, include tert-butyl group, tetrahydropyran-2-yl group, tetrahydrofuran-2-yl group, 4-methoxytetrahydropyran-4-yl group, 1-ethoxyethyl group, 1-butoxyethyl group, 1-propoxyethyl group, 3-oxocyclohexyl group, 2-methyl-2-adamantyl group, 2-ethyl-2-adamantyl group, 8-methyl-8-tricyclo[5.2.1.0$^{2,6}$] decyl group, 1,2,7,7-tetramethyl-2-norbornyl group, 2-acetoxymenthyl group, 2-hydroxymenthyl group and 1-methyl-1-cyclohexylethyl group, but are not restricted thereto. The proportion x1 of the units having an alicyclic lactone structure is 0<x1<1 but is preferably 0.1<x<0.8 from the standpoints of the resolution, adhesivity to the substrate, etc. of resist.

The resin of the general formula (9) having an alkyl group represented by R, as compared with resins having no alkyl group, has a high carbon density and high dry etching resistance.

Preferable weight-average molecular weight of the resist resin of the present invention is 2,000 to 200,000, and more preferable 3,000 to 100,000. It is because when the molecular weight is 2,000 or more, the resin film can be formed easily and, when the molecular weight is 200,000 or less, the resin has high solubility in solvents and also shows high resolution.

The positive-type chemically amplified resist of the present invention contains, as main components, a resin, a photo acid generator and a solvent capable of dissolving them. The content of the resin is ordinarily 60 to 99.9 parts by weight, preferably 70 to 99 parts by weight in 100 parts by weight of all the components excluding the solvent.

The photo acid generator used in the present invention may be any photo acid generator as long as it generates an acid upon irradiation with a light having a wavelength of 400 nm or less, preferably 180 to 220 nm, its mixture with the above-mentioned polymer compound of the present invention, etc. is sufficiently soluble in organic solvents, and the resulting solution can form a uniform film by a film formation method such as spin coating or the like. The photo acid generator may be used singly or in admixture of two or more kinds.

Usable examples of the photo acid generator include, for example, triphenylsulfonium salt derivatives of J.V. Crivello et al., described in Journal of the Organic Chemistry, Vol. 43, No. 15, pp. 3,055 to 3,058 (1978); other onium salts typified thereby (e.g. sulfonium salt compounds, iodinium salt compounds, phosphonium salt compounds, diazonium salt compounds and ammonium salt compounds); 2,6-dinitrobenzyl esters (O. Nalamasu et al., SPIE Proceeding, Vol. 2195, p. 137 (1994)); 1,2,3-tri(methanesulfonyloxy)benzene (Takumi Ueno et al., Proceeding of PME' 89, Kodansha, pp. 413 to 424 (1990)); sulfosuccinimide disclosed in JP-A-5-134416; and alkysulfonium salts described in U.S. Pat. No. 2,964,990.

The content of the photo acid generator is ordinarily 0.2 to 30 parts by weight, preferably 1 to 15 parts by weight in 100 parts by weight of all the components of the positive-type chemically amplified resist excluding the solvent. When the content is 0.2 part by weight or more, a sufficient sensitivity is obtained, making pattern formation easy. When the content is 30 parts by weight or less, a uniform film can be formed easily and a residue (a scum) is less likely to appear after development.

The positive-type chemically amplified resist of the present invention contains a proper amount of a solvent, in addition to a resin, a photo acid generator, etc. The solvent may be any solvent as long as it dissolves other components of a resin and a photo acid generator uniformly and the resulting resist can form a uniform film when coated by spin coating or the like. The solvent may be used singly or in admixture of two or more kinds. Specific examples of the preferred solvent include alcohols such as n-propyl alcohol, isopropyl alcohol, n-butyl alcohol and tert-butyl alcohol; esters such as methyl cellosolve acetate, ethyl cellosolve acetate, propylene glycol monoethyl ether acetate, methyl lactate, ethyl lactate, 2-methoxybutyl acetate, 2-ethoxyethyl acetate, methyl pyruvate, ethyl pyruvate, methyl 3-methoxypropionate and ethyl 3-methoxypropionate; cyclic ketones and cyclic alcohols such as N-methyl-2-pyrrolidinone, cyclohexanone, cyclopentanone and cyclohexanol; ketones such as methyl ethyl ketone; 1,4-dioxane; and glycol ethers such as ethylene glycol monomethyl ether, ethylene glycol monomethyl ether acetate, ethylene glycol monoethyl ether, ethylene glycol monoisopropyl ether, diethylene glycol monomethyl ether and diethylene glycol dimethyl ether; but are not restricted thereto.

The positive-type resist of the present invention contains, as basic components, a resin, a photo acid generator and a solvent, all mentioned above; however, it may contain as necessary other components such as dissolution-inhibiting agent, organic base, surfactant, coloring agent, stabilizer, coatability improver, dye and the like.

The method for pattern formation according to the present invention comprises coating the positive-type chemically amplified resist of the present invention on a substrate and then applying, to the resulting resist film, a light having a wavelength selected from 180 to 220 nm, via a mask pattern to transfer the mask pattern onto the resist film.

In this method, there are used essentially same steps of resist coating, baking before light application, baking after light application and development as in the pattern formation using a conventional chemically amplified resist.

Embodiments of the present invention are specifically described below by way of Examples.

SYNTHESIS EXAMPLE 1

Norbornene derivative represented by formula (19) (Endo form)

12.8 g of sodium boron hydride was added to 100 ml of tetrahydrofuran (hereinafter abbreviated to THF). Thereto was dropwise added, with ice-cooling, a solution of 50 g of 5-norbornene-endo-2,3-dicarboxylic acid anhydride (No. 146-03435, a product of Wako Pure Chemical Industries, Ltd.) dissolved in 200 ml of THF. The resulting mixture was stirred at room temperature for 3 hours. Then, 150 ml of 6 N hydrochloric acid was added with ice-cooling, followed by stirring at room temperature for 3 hours. The resulting precipitate was removed by filtration. The filtrate was concentrated under vacuum. To the residue was added 300 ml of chloroform. Thereto was added silica gel to remove impurities by adsorption. The resulting solution was subjected to distillation under reduced pressure to remove chloroform to obtain 16.5 g (yield: 36%) of an intended product.

$^1$H-NMR (CDCl$_3$): δ (ppm) 1.47 (1H,dd), 1.65 (1H,d), 3.06–3.15 (2H,m), 3.26–3.28 (1H,m), 3.32–3.36 (1H,m), 3.8 (1H,dd), 4.29 (1H,t), 6.3 (2H,s)

SYNTHESIS EXAMPLE 2

Norbornene derivative represented by formula (19) (Exo form)

100 g of 5-norbornene-endo-2,3-dicarboxylic acid anhydride was subjected to a reaction in a nitrogen atmosphere at 190 to 195° C. for 4 hours. The reaction mixture was allowed to cool and then recrystallized with toluene 5 times to obtain 28 g (yield: 28%) of 5-norbornene-exo-2,3-dicarboxylic acid anhydride. This 5-norbornene-exo-2,3-dicarboxylic acid anhydride was reduced by the same procedure as in Synthesis Example 1, to obtain an intended product (yield: 49%).

$^1$H-NMR (CDCl$_3$): δ (ppm) 1.39–1.58 (2H,m), 2.47–2.71 (2H,m), 2.89 (1H,s), 3.25 (1H,s), 3.95–4.03 (1H,m), 4.42–4.53 (1H,m), 6.1–6.35 (2H,m)

SYNTHESIS EXAMPLE 3

Norbornene derivative represented by formula (21) (Endo form, R is methyl group)

Synthesis was conducted in the same manner as in Synthesis Example 1 except that the 5-norbornene-endo-2,3-dicarboxylic acid anhydride was replaced by methyl-5-norbornene-endo-2,3-dicarboxylic acid anhydride (No. 136-05955, a product of Wako Pure Chemical Industries, Ltd.) (yield: 33%).

EXAMPLE 1

Resin represented by formula (23) (in the general formula (5), Z is a norbornene derivative (1) having a lactone structure, shown in Table 1; $R^1$ is a hydrogen atom; $R^2$ is a tert-butoxycarbonyltetracyclododecyl group; x=0.5; and y=0.5)

(23)

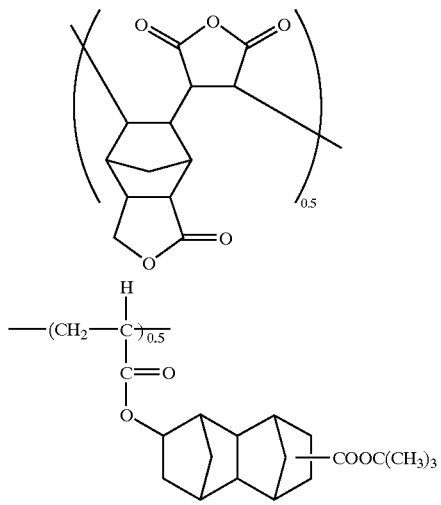

2.26 g of the norbornene derivative obtained in Synthesis Example 2, 1.475 g of maleic anhydride and 10 g of tert-butoxycarbonyltetracyclododecyl acrylate were dissolved in 30 ml of THF in a 100-ml eggplant-shaped flask provided with a reflux condenser. Thereto was added 0.394 g of azobisisobutyronitrile (hereinafter referred to as AIBN). The resulting mixture was refluxed with heating, in an argon atmosphere. After 12 hours, the mixture was allowed to cool and poured into 500 ml of ether. The resulting precipitate was collected by filtration and then subjected to reprecipitation for purification to obtain 2.8 g (yield: 20%) of an intended product. The product had a weight-average molecular weight (Mw) of 6,800 (polystyrene-reduced value) as measured by GPC and a degree of dispersion (Mw/Mn) of 2.24.

EXAMPLE 2

Resin represented by formula (24) (in the general formula (5), Z is a norbornene derivative (1) having a lactone structure, shown in Table 1; $R^1$ is a methyl group; $R^2$ is a 2-methyl-2-adamantyl group; x=0.5; and y=0.5)

(24)

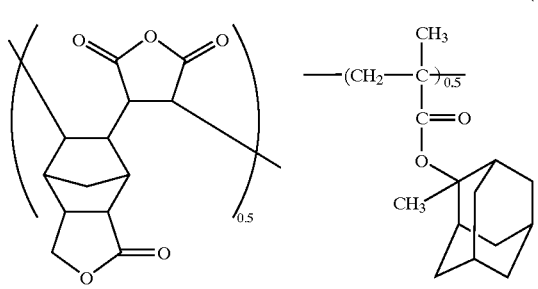

Synthesis was conducted in the same manner as in Example 1 except that the tert-butoxycarbonyltetracyclododecyl acrylate was replaced by 2-methyl-2-adamantyl methacrylate (yield: 30%). Mw=5,400, Mw/Mn=2.34

EXAMPLE 3

Resin represented by formula (25) (in the general formula (6), Z is a norbornene derivative (1) having a lactone structure, shown in Table 1; $R^3$ is a hydrogen atom; $R^4$ is a tert-butyl group; c is 0; a=0.4; and b=0.6)

(25)

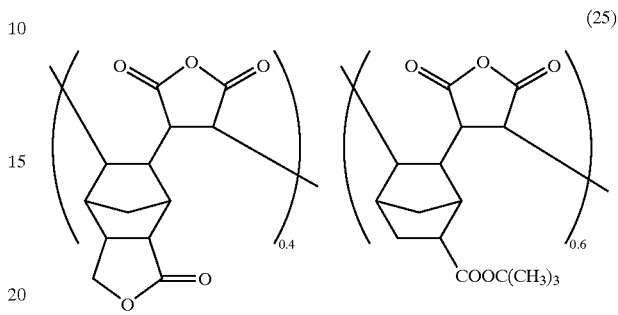

3 g of the norbornene derivative obtained in Synthesis Example 2, 4.9 g of maleic anhydride and 5.82 g of tert-butyl 5-norbornene-2-carboxylate were dissolved in 30 ml of THF in a 100-ml eggplant-shaped flask provided with a reflux condenser. Thereto was added 0.656 g of AIBN. The resulting mixture was refluxed with heating, in an argon atmosphere. After. 12 hours, the mixture was allowed to cool and poured into 300 ml of ether. The resulting precipitate was collected by filtration and then subjected to reprecipitation for purification to obtain 5.76 g (yield: 42%) of an intended product. Mw=4,800, Mw/Mn=2.28

EXAMPLE 4

Resin represented by formula (26) (in the general formula (6), Z is a norbornene derivative (1) having a lactone structure, shown in Table 1; $R^3$ is a hydrogen atom; $R^4$ is a tert-butyl group; c is 1; a=0.4; and b=0.6)

(26)

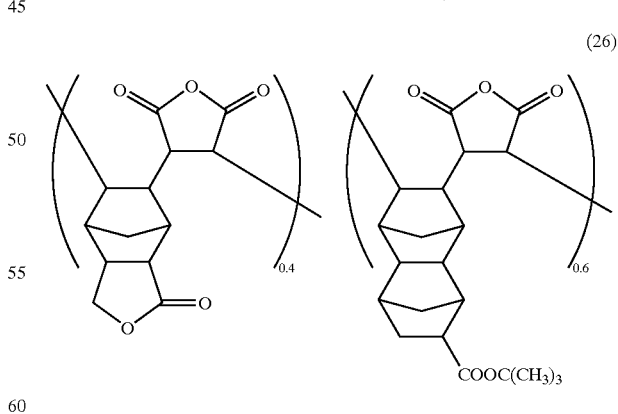

Synthesis was conducted in the same manner as in Example 3 except that the tert-butyl 5-norbornene-2-carboxylate was replaced by tert-butyl 3-tetracyclododecene-8-carboxylate (yield: 31%). Mw=8,400, Mw/Mn=2.41

EXAMPLE 5

Resin represented by formula (27)

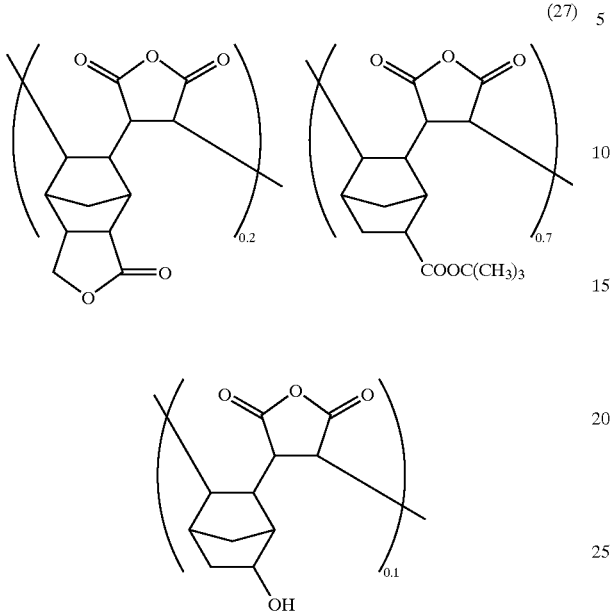

(27)

2.3 g of the norbornene derivative obtained in Synthesis Example 1, 5 g of maleic anhydride, 7.63 g of tert-butyl 5-norbornene-2-carbxylate and 0.56 g of 5-norbornene-2-ol were dissolved in 27 ml of THF in a 100-ml eggplant-shaped flask provided with a reflux condenser. Thereto was added 0.67 g of azobisisobutyronitrile. The resulting mixture was refluxed with heating, in an argon atmosphere. After 12 hours, the mixture was allowed to cool and poured into 300 ml of ether. The resulting precipitate was collected by filtration and then subjected to reprecipitation for purification to obtain 7.44 g (yield: 48%) of an intended product. Mw=7,200, Mw/Mn=2.36

EXAMPLE 6

Resin represented by formula (28)

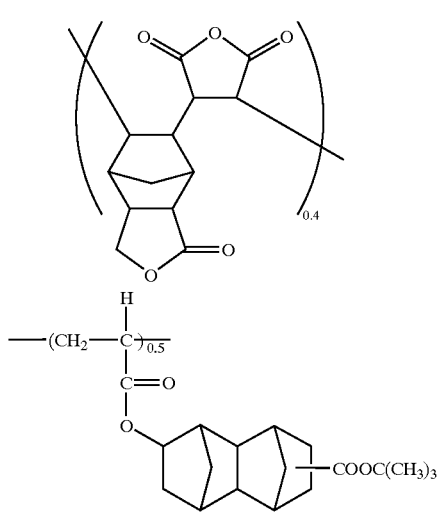

(28)

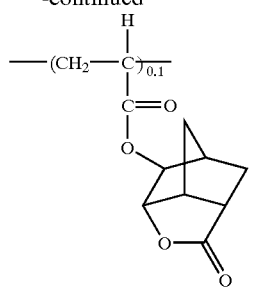

2 g of the norbornene derivative obtained in Synthesis Example 2, 1.3 g of maleic anhydride, 11.07 g of tert-butoxycarbonyltetracyclododecyl acrylate and 1.37 g of 5-acryloyloxy-2,6-norbornanecarbolactone were dissolved in 28 ml of THF in a 100-ml eggplant-shaped flask provided with a reflux condenser. Thereto was added 0.437 g of azobisisobutyronitrile. The resulting mixture was refluxed with heating, in an argon atmosphere. After 16 hours, the mixture was allowed to cool and poured into 300 ml of ether. The resulting precipitate was collected by filtration and then subjected to reprecipitation for purification to obtain 6.13 g (yield: 39%) of an intended product. Mw=10,400, Mw/Mn=2.46

EXAMPLE 7

Resin represented by formula (29)

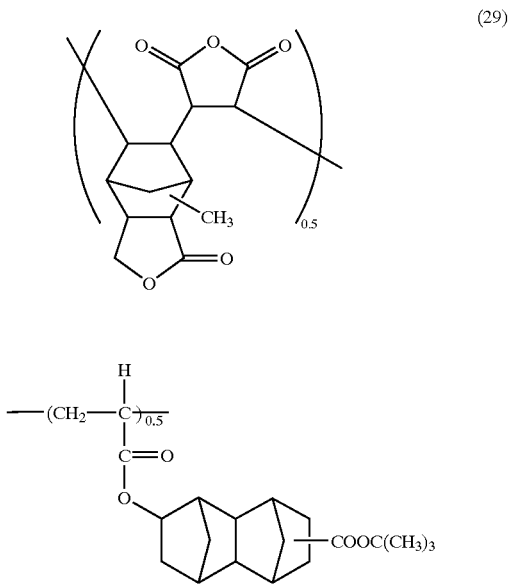

(29)

Synthesis was conducted in the same manner as in Example 1 except that the norbornene derivative obtained in Synthesis Example 2 was replaced by the norbornene derivative obtained in Synthesis Example 3 (yield: 24%) Mw=4,600, Mw/Mn=2.41

EXAMPLE 8

Resin represented by formula (30) (in the general formula (5), z is a norbornene derivative (3) having a lactone structure, shown in Table 1; $R^1$ is a hydrogen atom; $R^2$ is a tert-butoxycarbonyltetracyclododecyl group; x=0.5; and y=0.5)

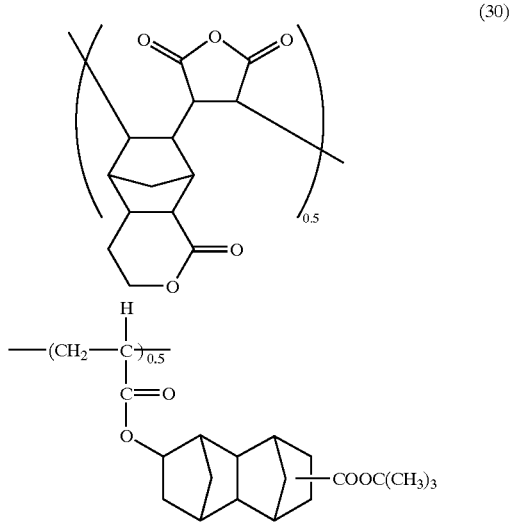

(30)

Synthesis was conducted in the same manner as in Example 1 except that the norbornene derivative obtained in Synthesis Example 2 was replaced by 5,8-methano-3,4,4a,5,8,8a-hexahydro-1H-2-benzopyran-1-one [synthesized by the method of T. Ikeda et al., described in J. Org. Chem., Vol. 50, No. 25, pp. 5,193 to 5,199 (1985)] (yield: 18%). Mw=4,200, Mw/Mn=2.41

EXAMPLE 9

Resin represented by formula (31) (in the general formula (8), q is 1; r is 1; p is 0; $R^7$ is a hydrogen atom; $R^8$ is a tert-butyl group; g=0.5; and h=0.5)

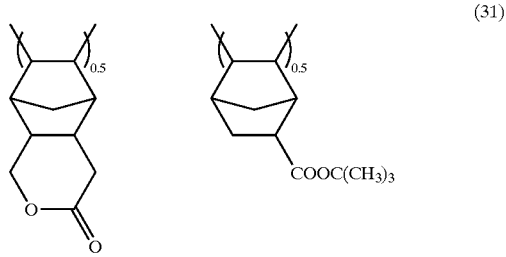

(31)

In 44 ml of chlorobenzene were dissolved 0.262 g of di-μ-chlorobis[(η-allyl)palladium (II)] and 0.488 g of silver hexafluoroantimonate. The resulting solution was stirred at room temperature. After 20 minutes, the reaction mixture was filtered. The filtrate was added to a mixture consisting of 11.87 g of 5,8-methano-3,4,4a,5,8,8a-hexahydro-3H-2-benzopyran-3-one [synthesized by the method of H. Shimomura et al., described in Tetrahedron Lett., No. 45, pp. 4,099 to 4,102 (1976)], 14.05 g of tert-butyl 5-norbornene-2-carboxylate, 0.2 ml of water and 170 ml of chlorobenzene. The resulting mixture was stirred at room temperature for 20 hours and then added to 1,200 ml of methanol. The resulting resin was collected by filtration and dissolved in 150 ml of chlorobenzene. To the resulting solution were added 30 ml of methanol and 3.2 g of sodium boron hydride. The resulting mixture was stirred at room temperature for 3 hours and then allowed to stand at room temperature for 24 hours. The resulting Pd (0) particles were removed by filtration. The filtrate was poured into 1,000 ml of methanol. The resulting resin was collected by filtration, whereby was obtained 16.58 g (yield: 64%) of an intended resin. Mw=7,100, Mw/Mn=2.34

EXAMPLE 10

Resin represented by formula (32) (in the general formula (8), q is 1; r is 0; p is 1; $R^7$ is a hydrogen atom; $R^8$ is a tert-butyl group; g=0.5; and h=0.5)

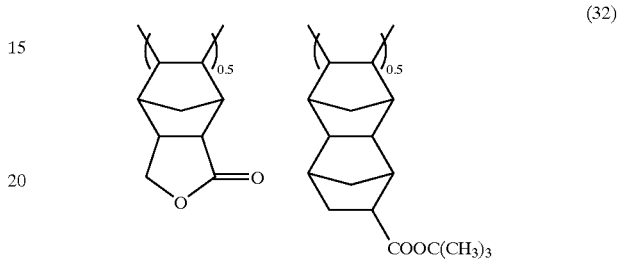

(32)

Synthesis was conducted in the same manner as in Example 9 except that the 5,8-methano-3,4,4a,5,8,8a-hexahydro-3H-2-benzopyran-3-one was replaced by the monomer obtained in Synthesis Example 2 and that the tert-butyl 5-norbornene-2-carboxylate was replaced by tert-butyl 3-tetracyclododecene-8-carboxylate. Yield: 21%, Mw=4,300, Mw/Mn=2.44

EXAMPLE 11

Resin represented by formula (33) (in the general formula (9), R is a methyl group; w is 1; wl is 1; $R^{10}$ is a hydrogen atom; $R^{11}$ is a tert-butyl group; g=0.5; and h=0.5)

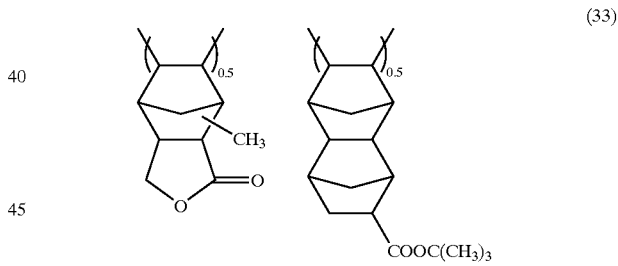

(33)

Synthesis was conducted in the same manner as in Example 9 except that the 5,8-methano-3,4,4a,5,8,8a-hexahydro-3H-2-benzopyran-3-one was replaced by the monomer obtained in Synthesis Example 3 and that the tert-butyl 5-norbornene-2-carboxylate was replaced by tert-butyl 3-tetracyclododecene-8-carboxylate. Yield: 16%, Mw=4,100, Mw/Mn=2.52

(Evaluation of Etching Resistances of Resins)

2 g of the resin obtained in Example 1 was dissolved in 10 g of propylene glycol monomethyl ether acetate. The resulting solution was filtered through a teflon filter of 0.2 μm and coated on a 3-inch silicon substrate by spin coating. The coated substrate was baked on a hot plate at 90° C. for 60 seconds to form a thin film of 0.7 μm in thickness. The film was measured for etching rate against $CF_4$ gas, by the use of a reactive ion etching (RIE) apparatus (DEM 451, a product of ANELVA Corporation). (The etching conditions: power=100 W, pressure=5 Pa, gas flow rate=30 sccm) The result of measurement is shown in Table 4. In a similar manner, etching rate was also measured for the resins obtained in Example 3, Example 4, Example 9, Example 10 and Example 11. Etching rate was further measured for comparative films of a novolac resist (PFI-15A, a product of Sumitomo Chemical Co., Ltd.), a poly(p-vinylphenol) used as a base resin of KrF resist, and a poly(methyl methacrylate) which is a resin having no bridge alicyclic hydrocarbon group in the molecular structure. The results of measurements for these comparative films are also shown in Table 4. Incidentally, each etching rate was indicated as a relative etching rate to that of novolac resist.

TABLE 4

| | Etching rate (relative rate) |
|---|---|
| Resin obtained in Example 1 | 1.1 |
| Resin obtained in Example 3 | 1.15 |
| Resin obtained in Example 4 | 1.0 |
| Resin obtained in Example 9 | 1.1 |
| Resin obtained in Example 10 | 0.9 |
| Resin obtained in Example 11 | 0.85 |
| Poly(methyl methacrylate) | 1.9 |
| Poly(p-vinylphenol) | 1.2 |
| Novolac resist (PFI-15A) | 1 |

The above results indicate that the resins of the present invention have low etching rates against $CF_4$ gas and superior dry etching resistance.

(Evaluation of Transparencies of Resins)

2.5 g of the resin obtained in Example 1 was dissolved in 10 g of propylene glycol monomethyl ether acetate. The resulting solution was filtered through a Teflon filter of 0.2 $\mu$m and coated on a 3-inch quartz substrate by spin coating. The coated substrate was baked on a hot plate at 90° C. for 60 seconds to form a thin film of 1 $\mu$m in thickness. This thin film was measured for transmittance at 193.4 nm of a central wavelength of ArF excimer laser beam, by the use of an ultraviolet-visible light spectrophotometer (UV-365, a product of Shimadzu Corporation). Similar measurements were made also for the resins obtained in Example 3, Example 4 and Example 10.

As a result, the transmittances were 72%/0.5 $\mu$m for the resin obtained in Example 1, 70%/0.5 $\mu$m for the resin obtained in Example 3, 69%/0.5 $\mu$m for the resin obtained in Example 4 and 62%/0.5 $\mu$m for the resin obtained in Example 10. From this, it was confirmed that the resins of the present invention show such transparency as they are usable as a single-layer resist.

(Evaluation of Patternings of Resists)

A resist having the following composition was prepared.
(a) Resin (Example 1): 2 g
(b) Photo acid generator (triphenylsulfonium trifrate (TPS)): 0.02 g
(c) Propylene glycol monomethyl ether acetate: 11.5 g The above mixture was filtered through a Teflon filter of 0.2 $\mu$m to prepare a resist. The resist was spin-coated on a 4-inch silicon substrate, followed by baking on a hot plate at 130° C. for 1 minute, to form a thin film of 0.39 $\mu$m in thickness. The film-formed wafer was placed in an experimental contact aligner sufficiently purged with nitrogen. On the resist film was tightly contacted a mask obtained by drawing a pattern on a quartz pate with chromium. An ArF excimer laser beam was applied to the resist film through the mask. Immediately thereafter, baking was conducted on a hot plate at 120° C. for 60 seconds, after which development was conducted for 60 seconds by immersion in a 2.38% aqueous TMAH solution of 23° C. Subsequently, rinsing with pure water was conducted for 60 seconds. As a result, only the light-exposed portion of the resist film dissolved in the developing solution and was removed, whereby a positive-type pattern was obtained. Similar evaluations were made also for the resists made using the resin obtained in Example 3, the resin obtained in Example 4 and the resin obtained in Example 10. In Table 5 are shown the results of each sensitivity and each resolution.

TABLE 5

| | Resolution ($\mu$m L/S) | Sensitivity (mJ/cm$^2$) |
|---|---|---|
| Resist containing Example 1 resin | 0.19 | 9 |
| Resist containing Example 3 resin | 0.20 | 6.5 |
| Resist containing Example 4 resin | 0.20 | 8 |
| Resist containing Example 10 resin | 0.20 | 7 |

From the above results, it became clear that the positive-type chemically amplified resists of the present invention show superior resolution. Also, it was confirmed that the positive-type chemically amplified resists of the present invention have superior adhesivity to substrate because there was no phenomenon such as pattern peeling or the like.

In the above, the examples of the present invention were described in detail. However, the specific constitution of the present resin is not restricted to those shown in the above examples and may be changed as long as the change does not deviate from the gist of the present invention.

What is claimed is:

1. A resist resin comprising an acid-decomposable group, which gives rise to decomposition of the acid-decomposable group to show an increased solubility to an aqueous alkali solution by the action of an acid, wherein the resist resin has, in the main chain, an alicyclic lactone structure represented by the following general formula (1):

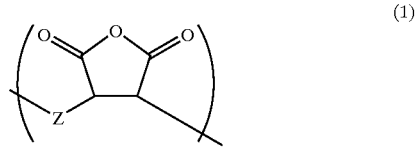

(1)

wherein Z comprises an alicyclic hydrocarbon group having a lactone structure which is represented by one the following formulas (11)–(22):

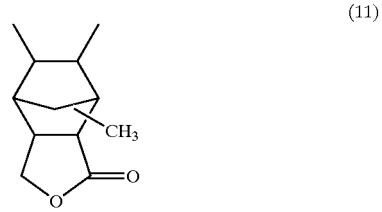

(11)

-continued

(12) 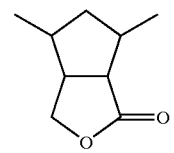

(13) 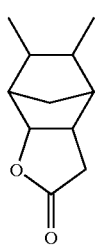

(14) 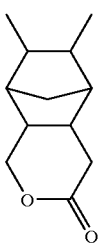

(15) 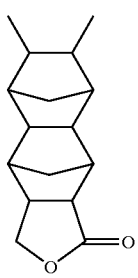

(16) 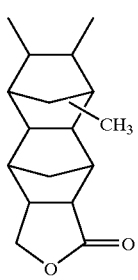

(17) 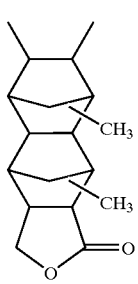

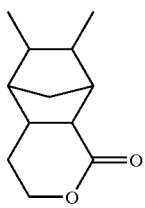

(18) 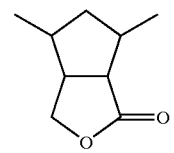

(19) 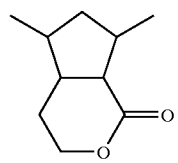

(20) 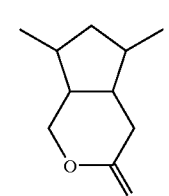

(21) 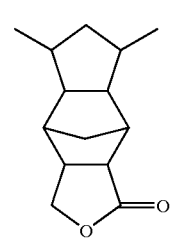

(22) 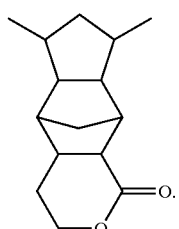

2. A positive-type chemically amplified resist comprising:
   a resist resin set forth in claim 1; and
   a photo acid generator which generates an acid when exposed to a light.

3. The positive-type chemically amplified resist according to claim 2, further comprising:
   a solvent which dissolves said resist resin and said photo acid generator,
   wherein said positive-type chemically amplified resist comprises an amount of resist resin in a range of 60 to 99.0 parts by weight, excluding said solvent.

4. The positive-type chemically amplified resist according to claim 3, wherein said positive-type chemically amplified resist comprises an amount of photo acid generator in a range of 0.2 to 30 parts by weight, excluding said solvent.

5. The positive-type chemically amplified resist according to claim 2, wherein said photo acid generator comprises one of a sulfonium salt compound, iodinium salt compound, phosphonium salt compound, diazonium salt compound, ammonium salt compound, 2,6-dinitrobenzyl ester, 1,2,3-tri(methanesulfonyloxy) benzene, sulfosuccinimide and alkylsulfonium salt.

6. A method for pattern formation, comprising:
coating a chemically amplified resist set forth in claim 2, on a substrate to be processed;
exposing the coated substrate to a light having a wavelength in a range from 180 to 220 nm;
baking the resulting substrate; and
subjecting the baked substrate to development.

7. A method for pattern formation according to claim 6, wherein the light comprises an ArF excimer laser beam.

8. A positive-type chemically amplified resist according to claim 2, further comprising:
a solvent which dissolves said resist resin and said photo acid generator,
wherein said positive-type chemically amplified resist comprises an amount of photo acid generator in a range of 0.2 to 30 parts by weight, excluding said solvent.

9. The resist resin according to claim 1, wherein said resist resin comprises a weight-average molecular weight in a range of 2,000 to 200,000.

10. The resist resin according to claim 1, wherein said resist resin is resistant to a dry etching.

11. A resist resin comprising an acid-decomposable group, which gives rise to decomposition of the acid-decomposable group to show an increased solubility to an aqueous alkali solution by the action of an acid, wherein the resist resin has, in the main chain, an alicyclic lactone structure represented by the following general formula (2):

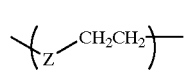

(2)

wherein Z comprises an alicyclic hydrocarbon group having a lactone structure which is represented by one the following formulas (11)–(17) and (19)–(22):

(11)
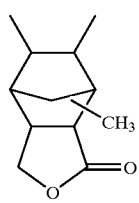

(12)
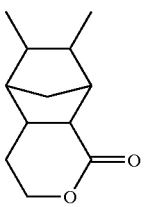

(13)
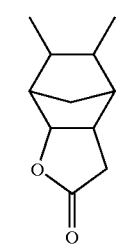

-continued

(14)
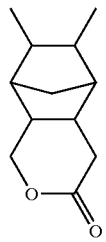

(15)
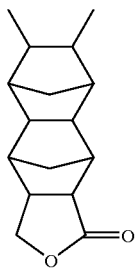

(16)
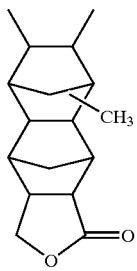

(17)
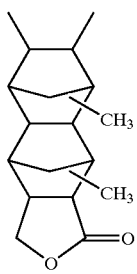

(18)
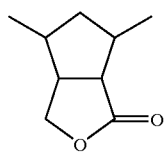

(19)
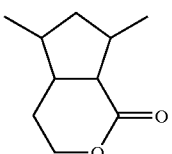

(20)
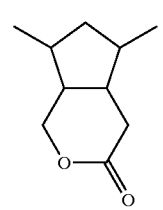

(21)
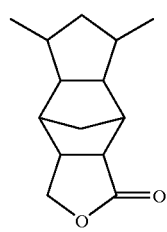

(22)
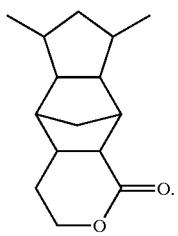

12. A positive-type chemically amplified resist comprising:

a resist resin set forth in claim 11; and a photo acid generator which generates an acid when exposed to a light.

13. A resist resin comprising an acid-decomposable group, which gives rise to decomposition of the acid-decomposable group to show an increased solubility to an aqueous alkali solution by the action of an acid, wherein the resist resin has, in the main chain, an alicyclic lactone structure represented by the following general formula (3):

(3)
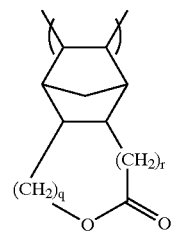

wherein q is 0 or a positive integer of 1 to 3, and r is 1 or 2.

14. A positive-type chemically amplified resist comprising:

a resist resin set forth in claim 13; and a photo acid generator which generates an acid when exposed to a light.

15. A resist resin comprising an acid-decomposable group, which gives rise to decomposition of the acid-decomposable group to show an increased solubility to an aqueous alkali solution by the action of an acid, wherein the resist resin has, in the main chain, an alicyclic lactone structure represented by the following general formula (4):

(4)
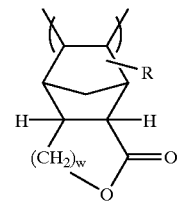

wherein R comprises an alkyl group having 1 to 4 carbon atoms, and w is a positive integer of 1 to 3.

16. A positive-type chemically amplified resist comprising:

a resist resin set forth in claim 15; and a photo acid generator which generates an acid when exposed to a light.

17. A resist resin comprising an acid-decomposable group, which gives rise to decomposition of the acid-decomposable group to show an increased solubility to an aqueous alkali solution by the action of an acid, wherein the resist resin has, in the main chain, an alicyclic lactone structure and is represented by the following general formula (5):

(5)
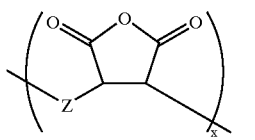 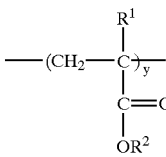

wherein Z comprises an alicyclic hydrocarbon group having a lactone structure which is represented by one the following formulas (11)–(22):

(11)
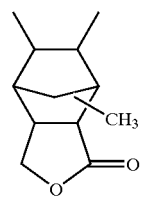

(12)
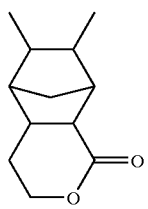

(13)
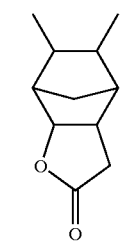

-continued

(14) 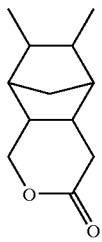

(15) 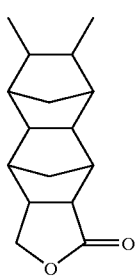

(16) 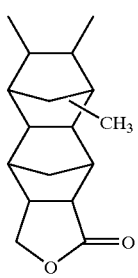

(17) 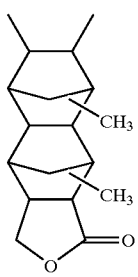

(18) 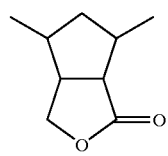

(19) 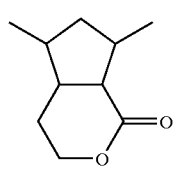

(20) 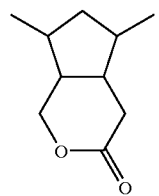

(21) 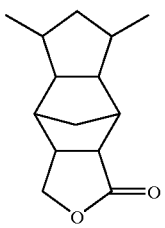

(22) 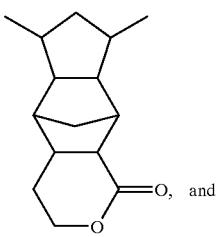, and wherein $R^1$ comprises a hydrogen atom or a methyl group; $R^2$ comprises an acid-decomposable group or a bridge cyclic hydrocarbon group of 7 to 13 carbon atoms having an acid-decomposable group; and X and y are each any number satisfying x+y=1, 0<x<1 and 0<y<1.

18. A positive-type chemically amplified resist comprising:
a resist resin set forth in claim 17; and
a photo acid generator which generates an acid when exposed to a light.

19. A resist resin comprising an acid-decomposable group, which gives rise to decomposition of the acid-decomposable group to show an increased solubility to an aqueous alkali solution by the action of an acid, wherein the resist resin has, in the main chain, an alicyclic lactone structure and is represented by the following general formula (6):

(6)

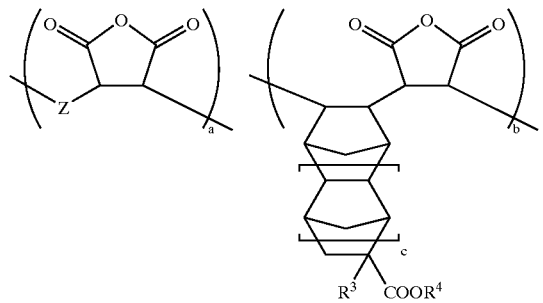

wherein Z comprises an alicyclic hydrocarbon group having a lactone structure which is represented by one the following formulas (11)–(22):
(11)
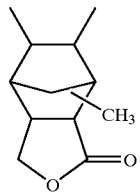
(12)
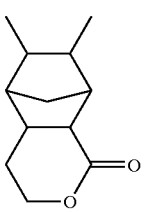
(13)
(14)
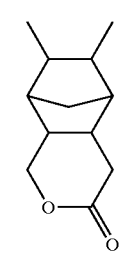
(15)
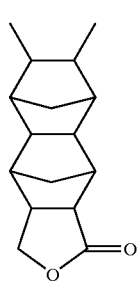
(16)
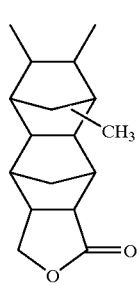
(17)
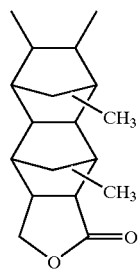
(18)
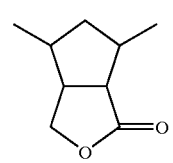
(19)
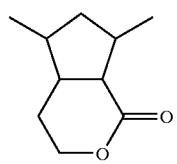
(20)
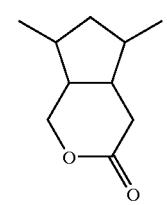
(21)
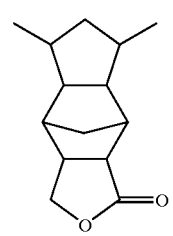
(22)
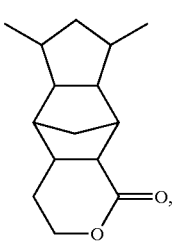
wherein $R^3$ comprises a hydrogen atom or a methyl group; $R^4$ comprises an acid-decomposable group; and a and b are each any number satisfying a+b=1, 0<a<1 and 0<b<1; and c is 0 or 1.

20. A positive-type chemically amplified resist comprising:
a resist resin set forth in claim 19; and
a photo acid generator which generates an acid when exposed to a light.

21. A resist resin comprising an acid-decomposable group, which gives rise to decomposition of the acid-decomposable group to show an increased solubility to an aqueous alkali solution by the action of an acid, wherein the resist resin has, in the main chain, an alicyclic lactone structure and is represented by the following general formula (8):

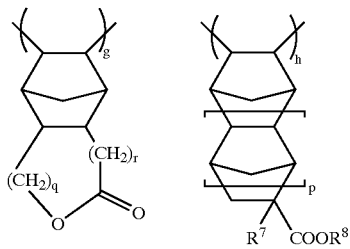

(8)

wherein q is 0 or a positive integer of 1 to 3; r is 0, 1 or 2; p is 0 or 1, with a proviso that when r is 0, p is 1; $R^7$ comprises a hydrogen atom or a methyl group; $R^8$ comprises an acid-decomposable group; and g and h are each any number satisfying $g+h=1$, $0<g<1$ and $0<h<1$.

22. A positive-type chemically amplified resist, comprising:
the resist resin set forth in claim 21; and
a photo acid generator which generates an acid when exposed to light.

23. A resist resin comprising an acid-decomposable group, which gives rise to decomposition of the acid-decomposable group to show an increased solubility to an aqueous alkali solution by the action of an acid, wherein the resist resin has, in the main chain, an alicyclic lactone structure and is represented by the following general formula (9):

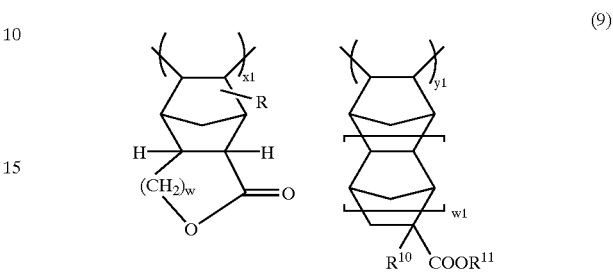

(9)

wherein R comprises an alkyl group of 1 to 4 carbon atoms; w is a positive integer of 1 to 3; wl is 0 or 1; $R^{10}$ comprises a hydrogen atom or a methyl group; $R^{11}$ comprises an acid-decomposable group; and xl and yl are each any number satisfying $xl+yl=1$, $0<xl<1$ and $0<yl<1$.

24. A positive-type chemically amplified resist, comprising:
the resist resin set forth in claim 23; and
a photo acid generator which generates an acid when exposed to light.

* * * * *